United States Patent
Gupta et al.

(10) Patent No.: US 9,329,210 B1
(45) Date of Patent: May 3, 2016

(54) VOLTAGE MONITORING CIRCUIT

(71) Applicants: Sunny Gupta, Noida (IN); Nitin Pant, Delhi (IN); Shubhra Singh, Noida (IN)

(72) Inventors: Sunny Gupta, Noida (IN); Nitin Pant, Delhi (IN); Shubhra Singh, Noida (IN)

(73) Assignee: FREESCALE SEMIOCNDUCTOR, INC., Austin, TX (US)

(*) Notice: Subject to any disclaimer, the term of this patent is extended or adjusted under 35 U.S.C. 154(b) by 0 days.

(21) Appl. No.: 14/556,142

(22) Filed: Nov. 29, 2014

(51) Int. Cl.
| H03L 7/00 | (2006.01) |
| G01R 19/165 | (2006.01) |
| H03K 17/22 | (2006.01) |
| G05F 3/02 | (2006.01) |

(52) U.S. Cl.
CPC .............. *G01R 19/1659* (2013.01); *G05F 3/02* (2013.01); *H03K 17/22* (2013.01)

(58) Field of Classification Search
CPC . H02J 9/005; H02M 2001/0032; Y02B 70/16
See application file for complete search history.

(56) References Cited

U.S. PATENT DOCUMENTS

| 5,789,945 | A | 8/1998 | Cline |
| 6,184,701 | B1 | 2/2001 | Kim et al. |
| 6,384,619 | B1 | 5/2002 | Kim et al. |
| 6,498,513 | B1 | 12/2002 | Reynolds |
| 6,552,578 | B1 * | 4/2003 | Cheung ................. G06F 1/3203 327/175 |
| 6,727,839 | B2 | 4/2004 | Mulder et al. |
| 6,868,500 | B1 | 3/2005 | Kutz et al. |
| 8,330,517 | B1 | 12/2012 | Cline |
| 2008/0246509 | A1 | 10/2008 | Xiao et al. |
| 2009/0106609 | A1 | 4/2009 | Sato |
| 2010/0164469 | A1 | 7/2010 | Bansal |

* cited by examiner

*Primary Examiner* — Sibin Chen
(74) *Attorney, Agent, or Firm* — Charles E. Bergere

(57) ABSTRACT

An integrated circuit (IC) includes a reference voltage generator, a voltage regulator, a reset controller, and a voltage monitoring circuit. The reference voltage generator generates first and second reference voltages, and the voltage regulator generates a supply voltage. The reset controller stabilizes the first and second reference voltages in a first predetermined time period, and generates a power down signal after the first predetermined time period. The voltage monitoring circuit compares a level of the supply voltage with a level of the second reference voltage after the first predetermined time period and generates a (low) voltage monitor signal. The reset controller also generates a (high) reset signal when the supply voltage is greater than the second reference voltage.

17 Claims, 11 Drawing Sheets

VOLTAGE MONITORING CIRCUIT

BACKGROUND OF THE INVENTION

The present invention relates generally to integrated circuits, and, more particularly, to a voltage monitoring circuit for an integrated circuit.

Integrated circuits (IC) include various analog and digital circuits such as operational amplifiers, voltage regulators, power management controllers (PMC), sensors, logic circuits, and non-volatile memories. The voltage regulators generate and provide supply voltage signals to the analog and digital circuits while the PMCs monitor the supply voltage signals. A PMC includes voltage monitoring circuits such as high and low voltage detectors (HVD and LVD). The HVDs and LVDs insure that changes in voltage levels of the supply voltage signals beyond defined operating limits are detected in order to prevent damage to the IC caused by out of specification voltages.

FIG. 1 shows an IC 100 that includes a voltage regulator 102 for generating a supply voltage signal and a power management controller (PMC) 104. The PMC 104 includes a reference voltage generator 106 and a voltage monitoring circuit 108. The voltage monitoring circuit 108 includes a switching circuit 110 and a comparator 112. The switching circuit 110 includes a first switch 114 and a second switch 116. In this example, the voltage monitoring circuit 108 is a low-voltage detector (LVD) 108.

The reference voltage generator 106 generates an LVD reference voltage signal (not shown) that toggles between a low LVD reference voltage signal (hereinafter a "first reference voltage signal") and a high LVD reference voltage signal (hereinafter a "second reference voltage signal"), where the first reference voltage signal is less than the second reference voltage signal.

The switches 114 and 116 each have a first input terminal connected to the reference voltage generator 106 for receiving the reference voltage signals.

The comparator 112 has a first input terminal connected to the voltage regulator 102 for receiving the supply voltage signal, a second input terminal connected to the switches 116 and 114 for receiving one of the first and second reference voltage signals, and an output terminal for outputting a voltage monitor signal. The switches 114 and 116 each have a second input terminal connected to the output terminal of the voltage comparator circuit 112 for receiving the voltage monitor signal. The second input terminal of the switch 114 is an low active input terminal. The LVD reference voltage signal toggles between the first and second reference voltage signals based on the voltage monitor signal.

In operation, when the IC 100 is powered up, a power-on-reset (POR) generator (not shown) initializes the voltage monitor signal to a logic low state. The switch 114 receives the low voltage monitor signal, switches on, and outputs the second reference voltage signal. The switch 116 receives the low voltage monitor signal, and switches off. The comparator 112 compares the supply voltage signal with the second reference voltage signal.

When the supply voltage signal is less than the second reference voltage signal, the comparator 112 generates the voltage monitor signal at a logic low state. The switch 114 receives the low voltage monitor signal and continues to output the second reference voltage signal. When the supply voltage signal exceeds the second reference voltage signal, the comparator 112 generates a high voltage monitor signal. The switch 114 receives the high voltage monitor signal and switches off, while the switch 116 receives the high voltage monitor signal, switches on, and outputs the first reference voltage signal.

The comparator 112 compares the supply voltage signal with the first reference voltage signal. When the supply voltage signal is greater than the first reference voltage signal, the comparator 112 outputs the voltage monitor signal at a logic high state. When the supply voltage signal is less than the first reference voltage signal, the comparator 112 outputs the voltage monitor signal at a logic low state. Thus, the LVD reference voltage signal toggles between the first and second reference voltage signals based on the logic state of the voltage monitor signal.

When the IC 100 is powered on, various circuits (not shown) within the IC are reset, i.e., set to corresponding predefined states. A predefined state refers to a known and a stable state. To facilitate the reset of the circuits, the IC 100 further includes a reset controller (not shown). The POR generator generates a POR signal (not shown) to initiate a reset sequence. During the reset sequence, the reset controller initializes the circuits to corresponding predefined states.

Generally, the reset sequence includes multiple reset phases. For example, the IC 100 may have four reset phases (first through fourth). In the first reset or POR phase, circuits such as the voltage regulator 102 and the PMC 104 are initialized. The IC 100 transitions to a second reset phase from the first reset phase during which a clock signal is initialized, i.e., the IC 100 receives a predefined minimum number of clock cycles of the clock signal from a clock generator (not shown). Subsequently, the IC 100 transitions from the second reset phase to a third reset phase. In the third reset phase, a non-volatile memory such as a flash memory (not shown) is initialized. Further, configuration information such as factory settings and boot code in the non-volatile memory are accessed by the reset controller during the third reset phase. Next, the IC 100 transitions to a fourth reset phase during which the circuits perform self-tests and a few of the circuits fetch configuration settings from the non-volatile memory.

FIG. 2 is a timing diagram that illustrates the LVD reference voltage signal, a trimming code, the voltage monitor signal, a reset signal, and the reset phases of the IC 100. At power up (time period t0 to t2), the POR generator initializes the voltage monitor signal at a logic low state. The switch 114 receives the low voltage monitor signal, switches on, and outputs the second reference voltage signal. The voltage comparator circuit 112 compares the supply voltage signal with the second reference voltage signal. However, the supply voltage signal has a slow ramp rate, i.e., the voltage level of the supply voltage signal increases until a desired voltage level at a slow rate during the reset sequence (time period t0 to t16) is achieved.

During power up and the first reset phase (time period t0 to t4), the voltage level of the supply voltage signal is less than the voltage level of the second reference voltage signal. Thus, the voltage monitor signal generated by the voltage comparator circuit 112 is at a logic low state (time period t0 to t4).

At time t4, the voltage level of the supply voltage signal exceeds the voltage level of the second reference voltage signal and the voltage monitor signal toggles from low to high. During the second and third reset phases (time period t4 to t8) the voltage monitor signal is high and the LVD reference voltage signal toggles from the second reference voltage signal to the first reference voltage signal.

In the fourth reset phase, at time t9, the reset controller loads the trimming code into the reference voltage generator 106. As a result, the LVD reference voltage signal is trimmed at time t10. After the LVD reference voltage signal is trimmed, the LVD reference voltage signal toggles between trimmed first and second reference voltage signals based on the logic state of the voltage monitor signal. Thus, during time period t10 to t15, the voltage level of the supply voltage signal is substantially less than a voltage level of the trimmed first reference voltage signal. However, as the supply voltage signal has a slow ramp rate, the voltage level of the supply voltage signal remains substantially equal to the voltage level of the trimmed first reference voltage signal during time period t10 to t15. When a difference between the voltage levels of the supply voltage signal and the trimmed first reference voltage signal decreases (e.g. less than 10 millivolts), a response time of the voltage comparator circuit 112 increases. The response time of the voltage comparator circuit 112 is defined as the time required by the voltage comparator circuit 112 to change the logic state of the voltage monitor signal when the voltage levels of the supply voltage signal and the LVD reference voltage signal change. Such an increase in the response time of the voltage comparator circuit 112 is known as meta-stability. Thus, the voltage monitor signal fails to go low during time period t10 to t15 due to meta-stability.

Although the voltage level of the supply voltage signal is less than the voltage level of the trimmed first reference voltage signal, the voltage monitor signal generated by the voltage comparator circuit 112 stays high from time period t10 to t15. When the IC 100 is in the fourth reset phase, the logic high voltage monitor signal indicates that the voltage level of the supply voltage signal is greater than the voltage level of the trimmed first reference voltage signal. Thus, the reset controller receives the logic high voltage monitor signal and generates a high reset signal (time t13). The IC 100 exits the fourth reset phase and transitions to a run mode of operation (time period t13 to t15). This transition to the run mode at time t13 is referred to as a false reset de-assertion. At time t15, the voltage monitor signal goes low because the voltage level of the supply voltage signal is less than the voltage level of the trimmed first reference voltage signal. As a result, the reset signal generated by the reset controller is low and the IC 100 transitions back to the first reset phase. The IC 100 transitions through the reset phases of the reset sequence to the run mode of operation again. However, due to the slow ramp rate of the supply voltage signal, the voltage level of the supply voltage signal may be less than the voltage level of the trimmed first reference voltage signal (time t10). This results in an increase in the response time of the voltage comparator circuit 112 and hence, results in the IC 100 having multiple false reset de-assertions.

Various processes such as fetching and execution of code begins in the run mode. Such processes are interrupted when the IC 100 transitions back to the first reset phase and may result in loss of data packets. Further, when the IC 100 communicates with an external IC (not shown), the false reset de-assertion may result in a loss of data packets during the communication with the external IC. When the IC 100 is used in a display application, the false reset de-assertions cause the display to flicker. Moreover, to avoid damage to the IC 100 due to such multiple false reset de-assertions, the IC 100 may be permanently held in reset by a supervisory circuit, which in turn limits the availability of IC 100 for safety critical applications.

One way to overcome meta-stability uses a counter to gate the fourth reset phase of the IC 100 for a predetermined time. The predetermined time corresponds to the known worst case response time of the voltage comparator circuit 112 during the meta-stability condition. However, the response time of the voltage comparator circuit 112 is not deterministic. For example, if the meta-stability condition is overcome before the predetermined time period ends, there will be a loss of operational time of the IC 100, thereby ineffectively extending the time for which the IC 100 is in the reset phase. In another example, the meta-stability condition is not overcome even after the predetermined time period has lapsed. Thus, the counter may not efficiently gate the fourth reset phase and overcome meta-stability.

Therefore, it would be advantageous to have a voltage monitoring circuit in an IC that efficiently overcomes the meta-stability condition of the voltage monitoring circuit, and does not cause false reset de-assertions of the IC.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
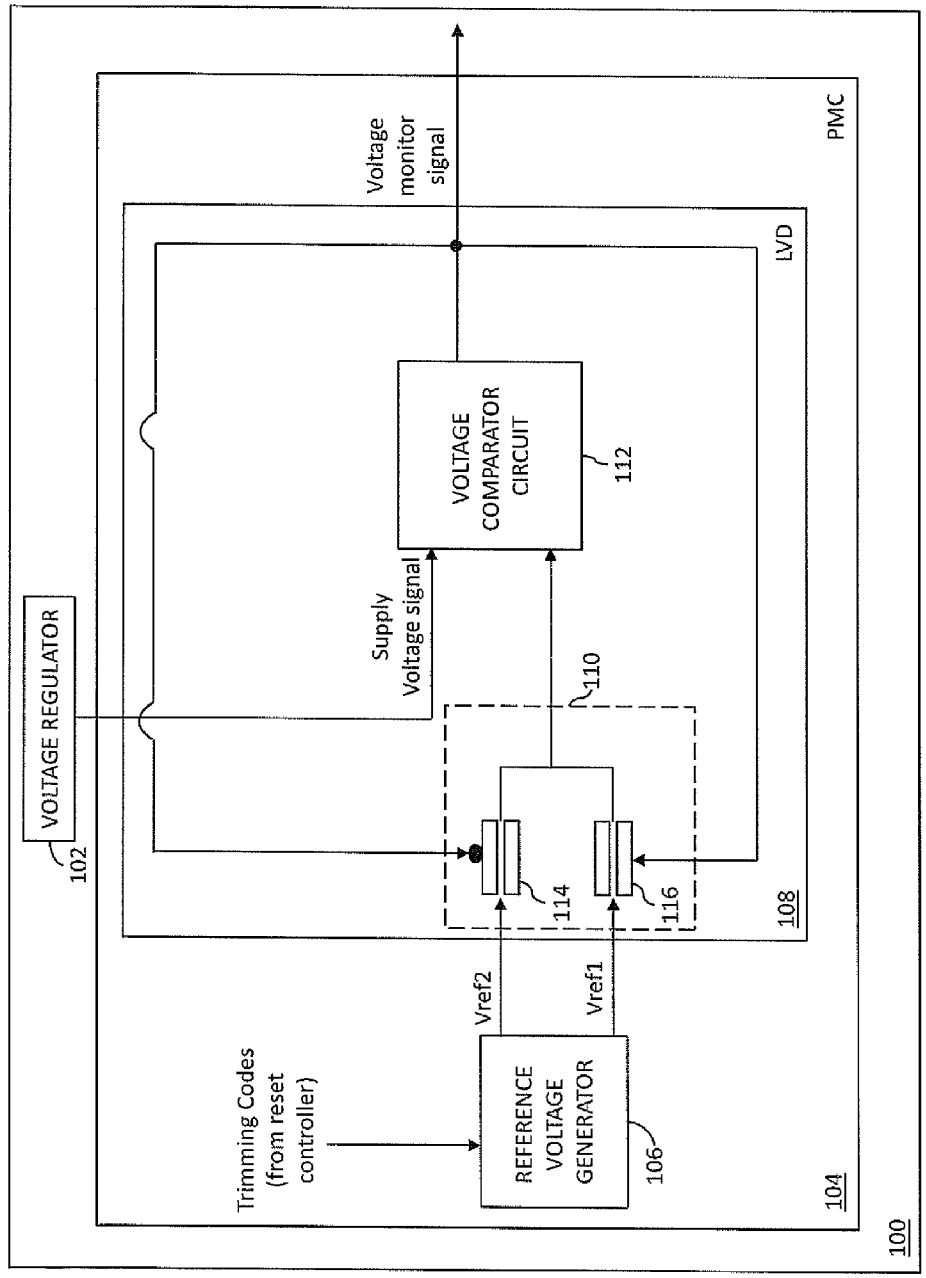
FIG. 1 is a schematic block diagram of a conventional integrated circuit (IC) that includes a voltage regulator and a power management controller (PMC)
Figure 2:
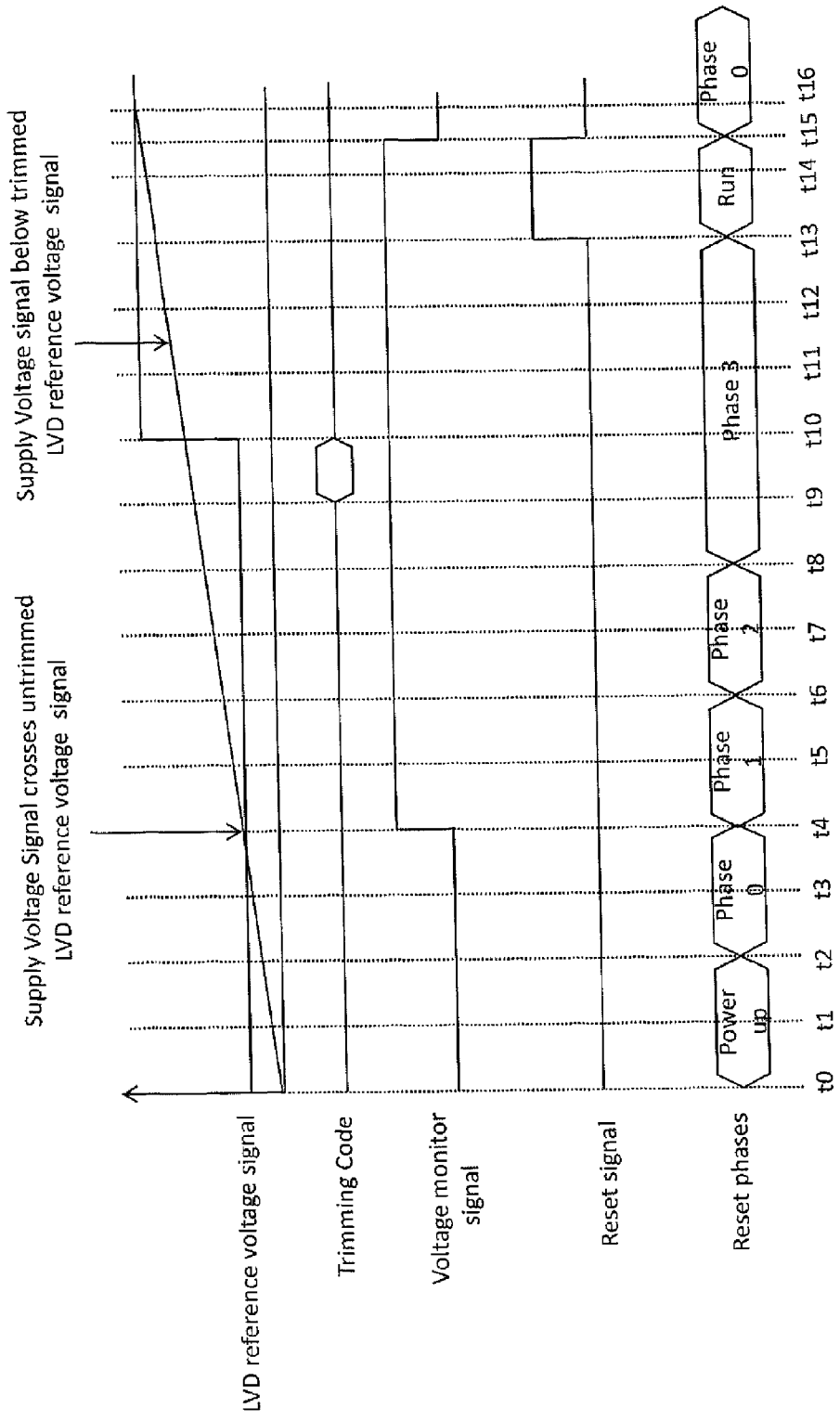
FIG. 2 is a timing diagram illustrating various signals generated by the IC of FIG. 1.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the terms multiplexer and mux are used interchangeably.

In an embodiment of the present invention, an integrated circuit (IC) includes a first reference voltage generator, a voltage regulator, a reset controller, and a first voltage monitoring circuit. The first reference voltage generator generates a first reference voltage signal. The voltage regulator generates a first supply voltage signal. The reset controller is connected to the first reference voltage generator for stabilizing the first reference voltage signal in a first predetermined time period and generating a power down signal after the first predetermined time period. The first voltage monitoring circuit is connected to the first reference voltage generator, the voltage regulator, and the reset controller for receiving the first reference voltage signal, the first supply voltage signal, and the power down signal, respectively, and generating a first voltage monitor signal. The first voltage monitor signal is generated by the first voltage monitoring circuit at a first logic state (e.g., high) when a voltage level of the first supply voltage signal exceeds a voltage level of the first reference voltage signal during the first predetermined time period, and at a second logic state (i.e., low) after the first predetermined time period, whereby the integrated circuit is configured in a safe state after the first predetermined time period.

In another embodiment of the present invention, an IC that includes a first reference voltage generator, a voltage regulator, a reset controller, and a first voltage monitoring circuit is provided. The first voltage monitoring circuit includes a switching circuit, a comparator, and a first logic gate. The first reference voltage generator generates first and second reference voltage signals. The voltage regulator generates a first supply voltage signal. The reset controller is connected to the first reference voltage generator for stabilizing the first reference voltage signal in a first predetermined time period and generating a power down signal after the first predetermined time period. The first voltage monitoring circuit generates a first voltage monitor signal. The switching circuit receives the first voltage monitor signal and is connected to the first reference voltage generator for receiving the first and second reference voltage signals. The switching circuit outputs the first reference voltage signal when the first voltage monitor signal is at a first logic state (e.g., high) during the first predetermined time period and the second reference voltage signal when the first voltage monitor signal is at a second logic state (i.e., low) during the second predetermined time period. The comparator has a first input terminal connected to the switching circuit for receiving one of the first and second reference voltage signals, a second input terminal connected to the voltage regulator for receiving the first supply voltage signal, and an output terminal for generating a first comparison signal that is logic high when a voltage level of the first supply voltage signal exceeds a voltage level of the first reference voltage signal during the first predetermined time period, and at logic low when a voltage level of the first supply voltage signal is less than a voltage level of the second reference voltage signal during the second predetermined time period. The first logic gate has a first input terminal connected to the output terminal of the comparator for receiving the first comparison signal, a second input terminal connected to the reset controller for receiving the power down signal, and an output terminal for generating the first voltage monitor signal at the first logic state during the first predetermined time period and at the second logic state during the second predetermined time period based on the power down signal, whereby the integrated circuit is configured in a safe state during the second predetermined time period.

In yet another embodiment of the present invention a method of resolving meta-stability in an IC is provided. The IC includes a first reference voltage generator, a voltage regulator, a reset controller, and a first voltage monitoring circuit is provided. The first voltage monitoring circuit includes a switching circuit, a comparator, and a first logic gate. The method includes generating a first reference voltage signal. The voltage regulator generates a first supply voltage signal. The first voltage monitoring circuit generates a first voltage monitor signal at a first logic state when a voltage level of the first supply voltage signal exceeds a voltage level of the first reference voltage signal during a first predetermined time period. The reset controller stabilizes the first reference voltage signal in the first predetermined time period and generates a power down signal after the first predetermined time period. The first voltage monitoring circuit generates a first voltage monitor signal at a second logic state after the first predetermined time period, whereby the integrated circuit is configured in a safe state after the first predetermined time period.

Various embodiments of the present invention provide an IC that includes a first reference voltage generator, a voltage regulator, a reset controller, and a first voltage monitoring circuit. The first voltage monitoring circuit includes a switching circuit. The first reference voltage generator generates first and second reference voltage signals. A voltage level of the second reference voltage signal is greater than a voltage level of the first reference voltage signal. The voltage regulator generates a first supply voltage signal. The reset controller stabilizes the first reference voltage signal in a first predetermined time period and generates a power down signal after the first predetermined time period. The first voltage monitoring circuit generates a first voltage monitor signal. The switching circuit receives the first voltage monitor signal, and the first and second reference voltage signals. The switching circuit outputs the first reference voltage signal when the first voltage monitor signal is at logic high state during the first predetermined time period and the second reference voltage signal when the first voltage monitor signal is at a logic low state after the first predetermined time period. Thus, after the first predetermined time period, a difference in voltage levels of the first supply voltage monitor signal and the second reference voltage signal is significantly greater. Hence, a response time of the first voltage monitoring circuit does not increase after the first predetermined time period and the IC does not experience a false reset de-assertion. Moreover, when the first supply voltage signal has a slow ramp rate, the IC does not have multiple false reset de-assertions. Thus, the IC operates smoothly without any loss of data packets, and in case of display applications without causing the display to flicker. Further, the IC is suitable for safety critical applications.

Figure 3:
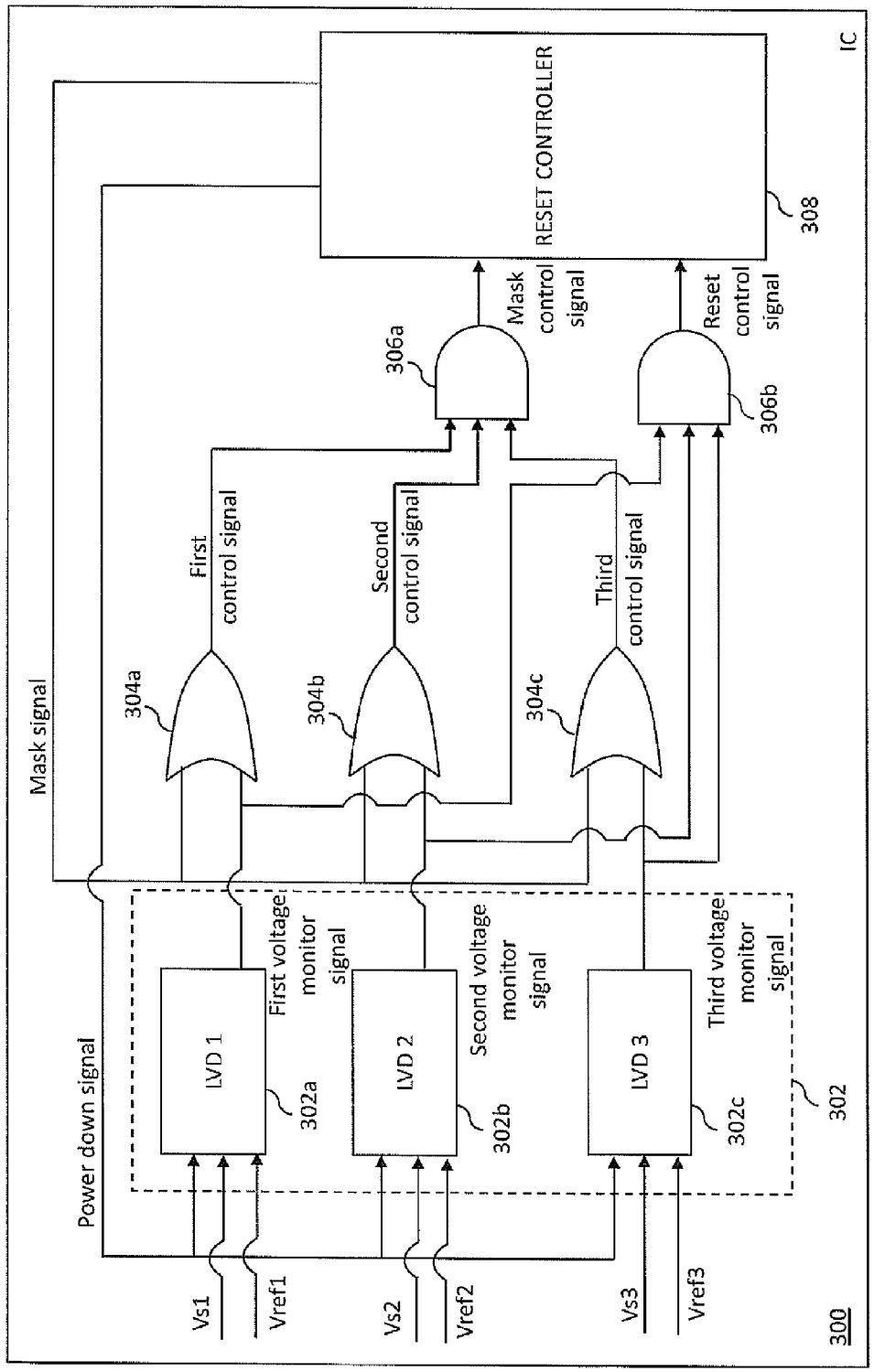
FIG. 3 is a schematic block diagram of an IC including multiple voltage monitoring circuits in accordance with an embodiment of the present invention.

Referring now to FIG. 3, a schematic block diagram of an integrated circuit (IC) 300 that includes multiple voltage monitoring circuits 302 in accordance with an embodiment of the present invention is shown. In an example, the voltage monitoring circuits 302 are low voltage detectors (LVD). The IC 300 includes first through third voltage monitoring circuits 302a-302c, first through third OR gates 304a-304c, first and second AND gates 306a and 306b, and a reset controller 308.

The reset controller 308 generates power down and mask signals. The first through third voltage monitoring circuits 302a-302c each have a first input terminal connected to the reset controller 308 for receiving the power down signal, a second input terminal connected to a voltage regulator (not shown) for receiving first through third supply voltage signals, respectively, a third input terminal connected to first through third reference voltage generators (not shown) for receiving first through third LVD reference voltage signals, respectively, and an output terminal for generating first through third voltage monitor signals, respectively.

The first through third OR gates 304a-304c each have a first input terminal connected to the reset controller 308 for receiving the mask signal, a second input terminal connected to the output terminals of the first through third voltage monitoring circuits 302a-302c for receiving the first through third voltage monitor signals, respectively, and an output terminal for outputting first through third control signals, respectively. The first AND gate 306a has a first input terminal connected to the output terminal of the first OR gate 304a for receiving the first control signal, a second input terminal connected to the output terminal of the second OR gate 304b for receiving the second control signal, a third input terminal connected to the output terminal of the third OR gate 304c for receiving the third control signal, and an output terminal for generating a mask control signal.

The second AND gate 306b has a first input terminal connected to the output terminal of the first voltage monitoring circuit 302a for receiving the first voltage monitor signal, a second input terminal connected to the output terminal of the second voltage monitoring circuit 302b for receiving the second voltage monitor signal, a third input terminal connected to the output terminal of the third voltage monitoring circuit 302c for receiving the third voltage monitor signal, and an output terminal for generating a reset control signal.

Figure 4:
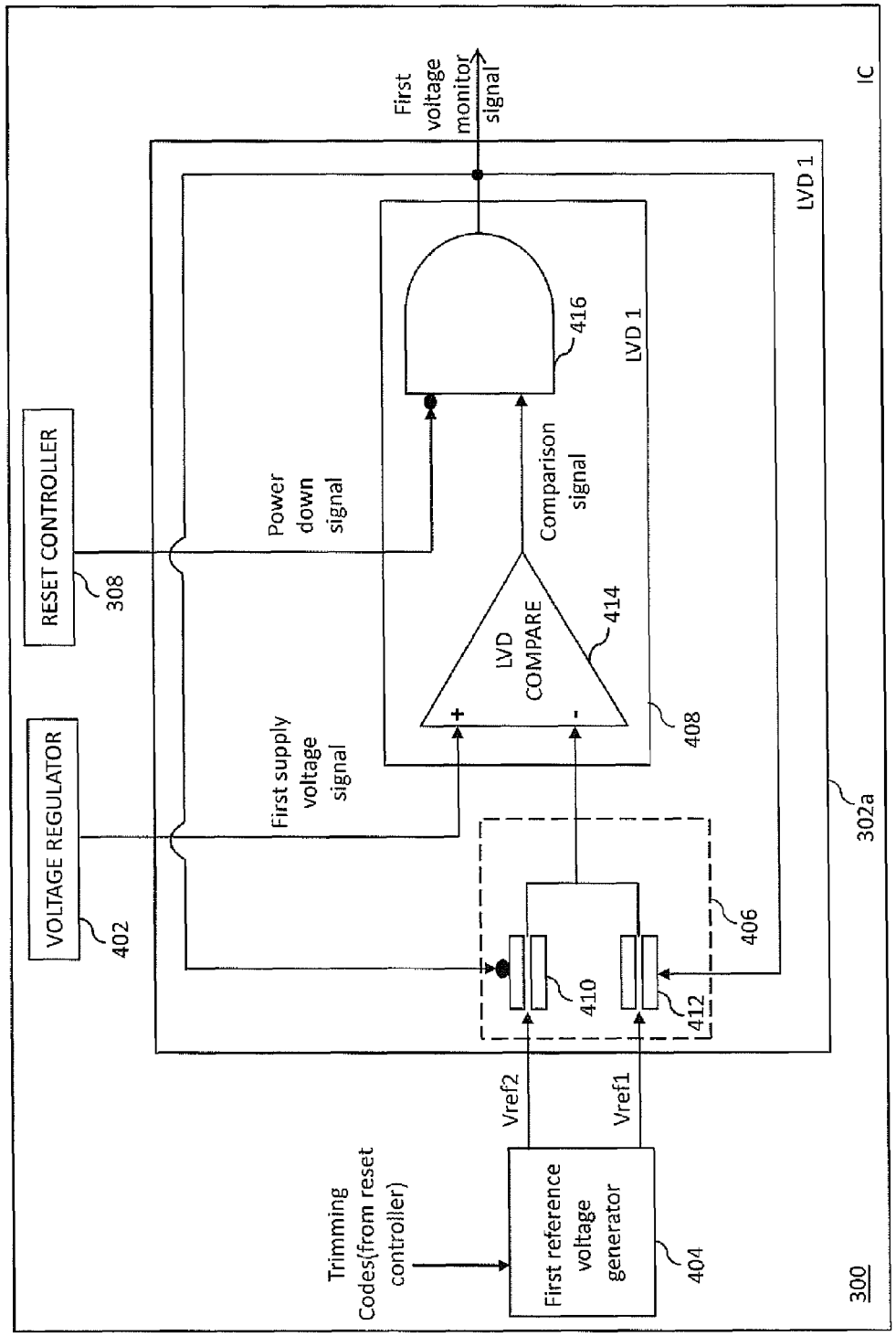
FIG. 4 is a schematic block diagram illustrating a voltage monitoring circuit of the IC of FIG. 3 in accordance with an embodiment of the present invention.

Referring now to FIG. 4, a schematic block diagram of the IC 300 that illustrates the first voltage monitoring circuit 302a in accordance with the embodiment of the present invention is shown. The IC 300 further includes a voltage regulator 402 and a first reference voltage generator 404. The first voltage monitoring circuit 302a includes a switching circuit 406 and a voltage comparator circuit 408. The switching circuit 406 includes first and second switches 410 and 412 (also referred to as a "switch 410" and a "switch 412", respectively). The voltage comparator circuit 408 includes a comparator 414 and an AND gate 416.

The voltage regulator 402 generates the first supply voltage signal. The first supply voltage signal has a slow ramp rate, i.e., a voltage level of the first supply voltage signal increases until a desired voltage level at a slow rate during a reset sequence.

The reset controller 308 fetches a trimming code from an internal memory (not shown) and provides the trimming code to the first reference voltage generator 404. The first reference voltage generator 404 generates the first LVD reference voltage signal (not shown) that toggles between a low LVD reference voltage signal (hereinafter referred to as a "first reference voltage signal") and a high LVD reference voltage signal (hereinafter referred to as a "second reference voltage signal"). The first reference voltage generator 404 receives the trimming code and generates the first LVD reference voltage signal at a higher voltage level than the voltage level of the first after a first predetermined time period.

The switch 412 has a first input terminal connected to the first reference voltage generator 404 for receiving the first reference voltage signal. The switch 410 has a first input terminal connected to the first reference voltage generator 404 for receiving the second reference voltage signal.

The comparator 414 has a first input terminal connected to the voltage regulator 402 for receiving the first supply voltage signal, a second input terminal connected to the switches 412 and 410 for receiving at least one of the first and second reference voltage signals, and an output terminal for outputting a comparison signal.

The AND gate 416 has a first input terminal connected to the reset controller 308 for receiving the power down signal, a second input terminal connected to the output terminal of the comparator 414 for receiving the comparison signal, and an output terminal for generating the first voltage monitor signal. The first input terminal of the AND gate 416 is an active low input terminal.

The switches 410 and 412 each have a second input terminal connected to the output terminal of the AND gate 416 for receiving the first voltage monitor signal. The second input terminal of the switch 410 is an active low input terminal. The first LVD reference voltage signal toggles between the first and second reference voltage signals based on the first voltage monitor signal.

Similarly, the second LVD reference voltage signal, generated by the second reference voltage generator, toggles between third and fourth reference voltage signals based on the second voltage monitor signal. Further, the third LVD reference voltage signal, generated by the third reference voltage generator, toggles between fifth and sixth reference voltage signals based on the third voltage monitor signal.

Figure 5:
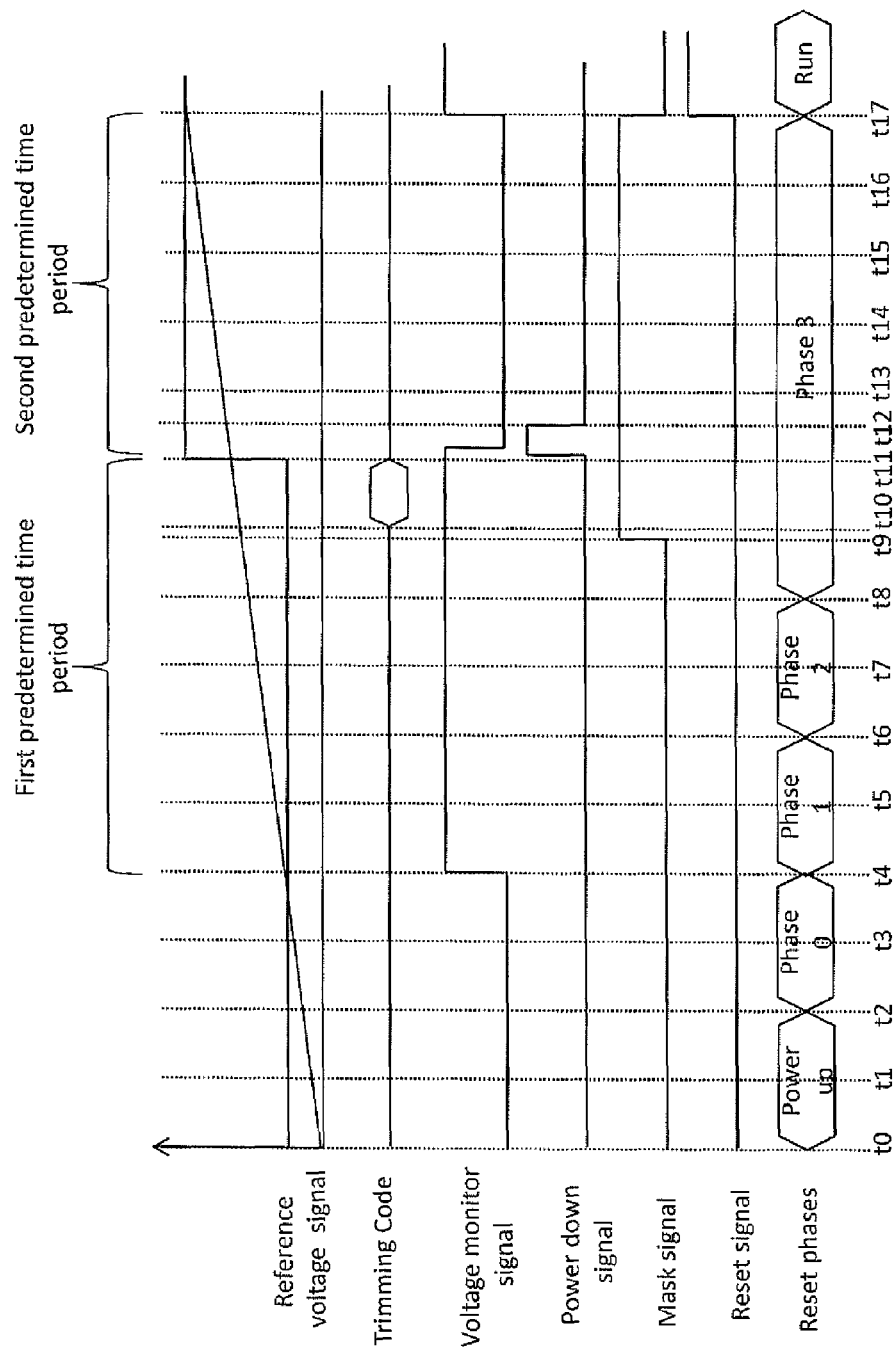
FIG. 5 is a timing diagram illustrating various signals generated by the IC of FIGS. 3 and 4 in accordance with an embodiment of the present invention.

Referring now to FIG. 5, a timing diagram that illustrates the first LVD reference voltage signal, the trimming code, the first voltage monitor signal, the power down signal, the mask signal, the reset signal, and reset phases of the IC 300 in accordance with the embodiment of the present invention is shown. At time t0, when the IC 300 is powered up, a power-on-reset generator (POR) (not shown) initializes the first voltage monitor signal to logic low state.

The reset controller 308 generates the power down signal at logic low state, the switch 410 is switched on, and the switch 412 is switched off. Thus, the switch 410 provides the second reference voltage signal to the comparator 414 that compares the first supply voltage signal with the second reference voltage signal. During power up and a first reset phase (time period t0 to t4), the voltage level of the first supply voltage signal is less than a voltage level of the second reference voltage signal. Thus, the comparator 414 outputs the comparison signal at a logic low state.

The AND gate 416 receives the low comparison signal and the low power down signal and generates the first voltage monitor signal at a logic low state (time period t0 to t4). The switch 410 receives the logic low voltage monitor signal and switches on. Hence, the switch 410 continues to output the second reference voltage signal.

At time t4, the voltage level of the first supply voltage signal exceeds the voltage level of the second reference voltage signal and hence, the first voltage monitor signal toggles from low to high. During second and third reset phases (time period t4 to t8), the first voltage monitor signal is high and the first LVD reference voltage signal toggles from the second reference voltage signal to the first reference voltage signal.

In a fourth reset phase (time period t8 to t17), when the reset controller 308 receives one of the first through third voltage monitor signals at a logic low state, the reset controller 308 generates a low reset signal and the IC 300 remains held in the reset sequence. At time t9, the reset controller 308 generates a high mask signal (time period t9-t17). The logic high mask signal ensures that the reset controller 308 does not receive the first through third voltage monitor signals at a logic low state until the first through third voltage monitoring circuits generate the first through third voltage monitor signals, respectively, at logic high state. The first OR gate 304a receives the high mask signal and the first voltage monitor signal and generates the first control signal at logic high state. Similarly, the second and third OR gates 304b and 304c generate the second and third control signals, respectively, at logic high states. The first AND gate 306a receives the logic high first through third control signals and generates the mask control signal at logic high state. At time t10, the reset controller 308 loads the trimming code in to the first reference voltage generator 404. As a result, the first LVD reference voltage signal is trimmed at time t11. The time period t4-t11 is referred to as a first predetermined time period. Further, after time t11, the reset controller 308 generates the power down signal at logic high state for a short time interval (time period t11-t12). Thus, the AND gate 416 generates the first voltage monitor signal at logic low state. The switch 410 receives the logic low voltage monitor signal and switches on. Hence, the switch 410 outputs the second reference voltage signal during a second predetermined time period (time period t11 to t17). After the first LVD reference voltage signal is trimmed, the first LVD reference voltage signal toggles between trimmed first and second reference voltage signals based on the logic state of the voltage monitor signal. The voltage level of the first supply voltage signal is less than a voltage level of the trimmed second reference voltage signal (time period t11 to t17). The difference between the voltage levels of the first supply voltage signal and the trimmed second reference voltage signal is significantly greater (e.g., between 10 millivolts to 1 volt). As a result, the response time of the voltage comparator circuit 408 does not increase and the IC 300 does not experience multiple false reset de-assertions. The IC 300 operates smoothly without any loss of data packets, and in case of display applications, without causing the display to flicker.

At time t17, the voltage level of the first supply voltage signal exceeds the voltage level of the trimmed second reference voltage signal. The comparator 414 generates the comparison signal and consequently, the first voltage monitor signal at logic high state. Similarly, at time t17, the second and third voltage monitoring circuits 302b and 302c generate the second and third voltage monitor signals at logic high state, respectively. Thus, the second AND gate 306b generates the reset control signal at logic high state. The second AND gate 306b indicates to the reset controller 308 that the first through third voltage monitor signals are at logic high state by way of the logic high reset control signal. The reset controller 308 receives the logic high reset control signal and generates the mask signal at logic low state (time t17). At time t17, the first through third OR gates 304a-304c continue to output the first through third control signals at logic high state. Consequently, the first AND gate 306a generates the mask control signal at logic high state. The reset controller 308 generates the reset signal at logic high state based on the mask control signal and the reset control signal. Thus, the IC 300 transitions in to a run mode of operation at time t17 and does not undergo a false reset de-assertion after time t17.

Figure 6:
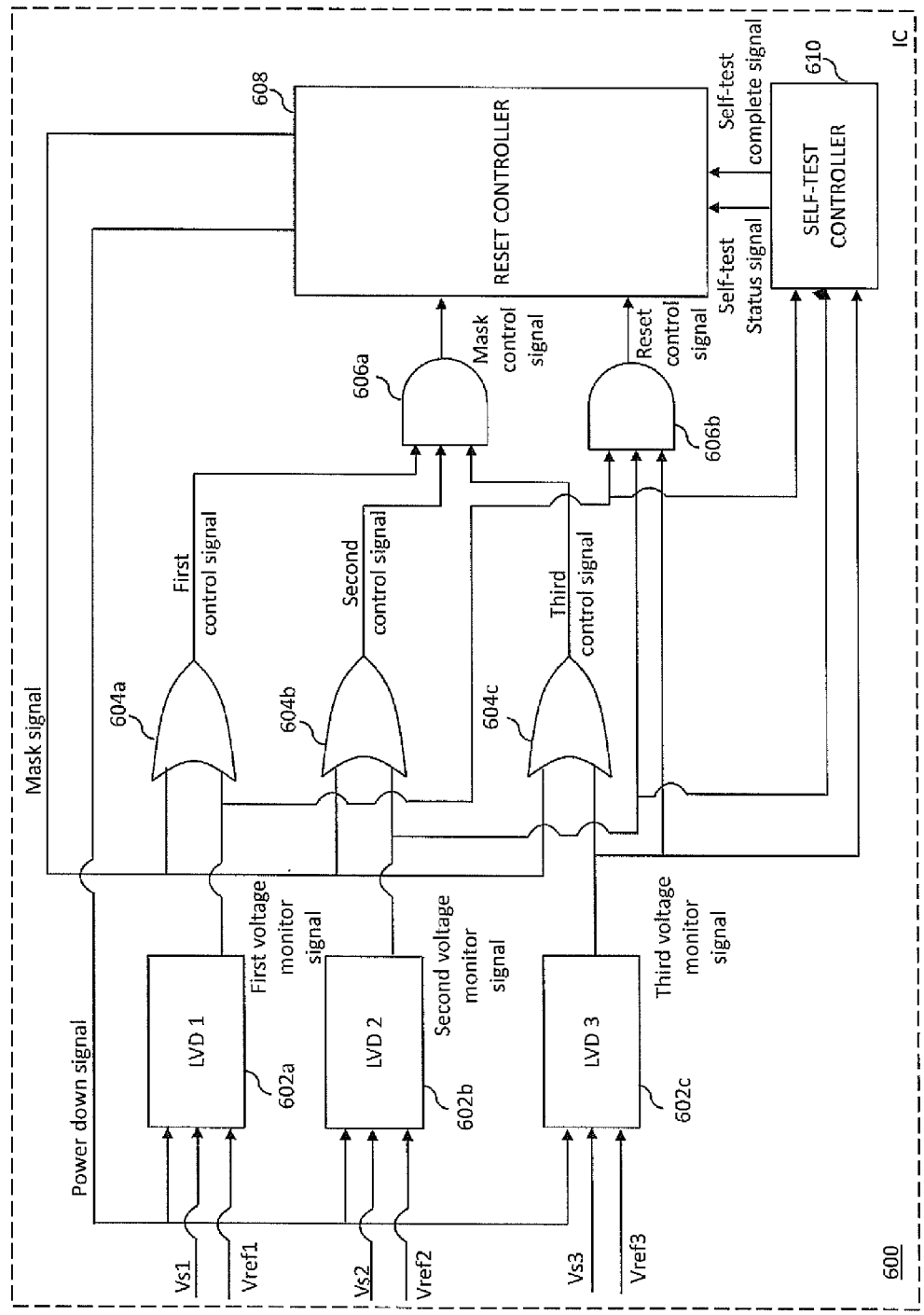
FIG. 6 is a schematic block diagram of an IC including multiple voltage monitoring circuits in accordance with another embodiment of the present invention.

Referring now to FIG. 6, a schematic block diagram of an integrated circuit (IC) 600 that includes multiple voltage monitoring circuits 602 in accordance with another embodiment of the present invention is shown. In an example, the voltage monitoring circuits 602 are low voltage detectors. The IC 600 includes first through third voltage monitoring circuits 602a-602c, first through third OR gates 604a-604c, first and second AND gates 606a and 606b, a reset controller 608, and a self-test controller 610. The self-test controller 610 aids in testing the functioning of the voltage monitoring circuits 602.

The first through third voltage monitoring circuits 602a-602c, the first through third OR gates 604a-604c, the first and second AND gates 606a and 606b, and the reset controller 608 are structurally and functionally similar to the first through third voltage monitoring circuits 302a-302c, the first through third OR gates 304a-304c, the first and second AND gates 306a and 306b, and the reset controller 308 of the IC 300 of FIG. 3, respectively.

The self-test controller 610 is connected to the first through third voltage monitoring circuits 602a-602c and receives the first through third voltage monitor signals, respectively, and generates self-test status and self-test complete signals. The reset controller 308 further receives the self-test status and self-test complete signals.

Figure 7:
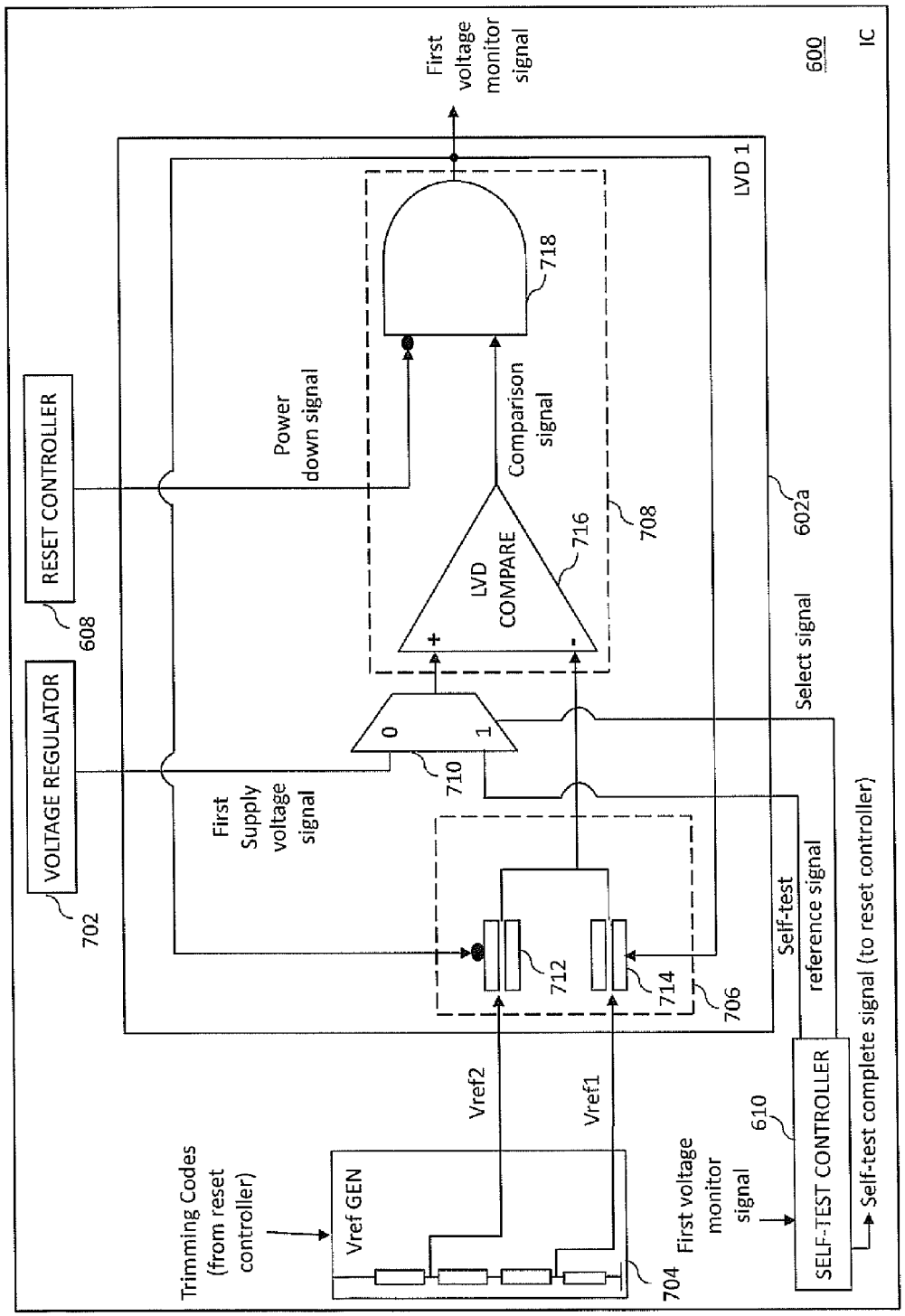
FIG. 7 is a schematic block diagram illustrating a voltage monitoring circuit of the IC of FIG. 6 in accordance with another embodiment of the present invention.

Referring now to FIG. 7, a schematic block diagram of the IC 600 that illustrates the first voltage monitoring circuit 602a in accordance with the another embodiment of the present invention is shown. The IC 600 further includes a voltage regulator 702 and the first reference voltage generator 704. The first voltage monitoring circuit 602a includes a switching circuit 706, a voltage comparator circuit 708, and a multiplexer or mux 710. The switching circuit 706 includes first and second switches 712 and 714 (also referred to as "switch 712" and "switch 714", respectively). The voltage comparator circuit 708 includes a comparator 716 and an AND gate 718.

The voltage regulator 702, the first reference voltage generator 704, the switching circuit 706, and the voltage comparator circuit 708 are structurally and functionally similar to the voltage regulator 402, the first reference voltage generator 404, the switching circuit 406, and the voltage comparator circuit 408 of the IC 300 of FIG. 4, respectively. The self-test controller 610 generates a self-test reference signal and a select signal.

The mux 710 has a first input terminal connected to the voltage regulator 702 for receiving the first supply voltage signal, a second input terminal connected to the self-test controller 610 for receiving the self-test reference signal, a select input terminal connected to the self-test controller 610 for receiving the select signal, and an output terminal for outputting at least one of the first supply voltage signal and the self-test reference signal based on the select signal.

The comparator 716 has a first input terminal connected to the mux 710 for receiving at least one of the first supply voltage signal and the self-test reference signal, a second input terminal connected to the switches 714 and 712 for receiving at least one of the first and second reference voltage signals, and an output terminal for outputting a comparison signal.

The AND gate 718 has a first input terminal connected to the reset controller 608 for receiving the power down signal, a second input terminal connected to the output terminal of the comparator 716 for receiving the comparison signal, and an output terminal for generating the first voltage monitor signal. The first input terminal of the AND gate 718 is an active low input terminal. The switches 712 and 714 each have a second input terminal connected to the output terminal of the AND gate 718 for receiving the first voltage monitor signal. The second input terminal of the switch 712 is an active low input terminal.

The first LVD reference voltage signal toggles between the first and second reference voltage signals based on the first voltage monitor signal. Similarly, the second LVD reference voltage signal, generated by the second reference voltage generator, toggles between third and fourth reference voltage signals based on the second voltage monitor signal. Further, the third LVD reference voltage signal, generated by the third reference voltage generator, toggles between fifth and sixth reference voltage signals based on the third voltage monitor signal. The self-test controller 610 is connected to the output terminal of the AND gate 718 for receiving the first voltage monitor signal and generating the self-test status signal based on the first voltage monitor signal.

Figure 8:
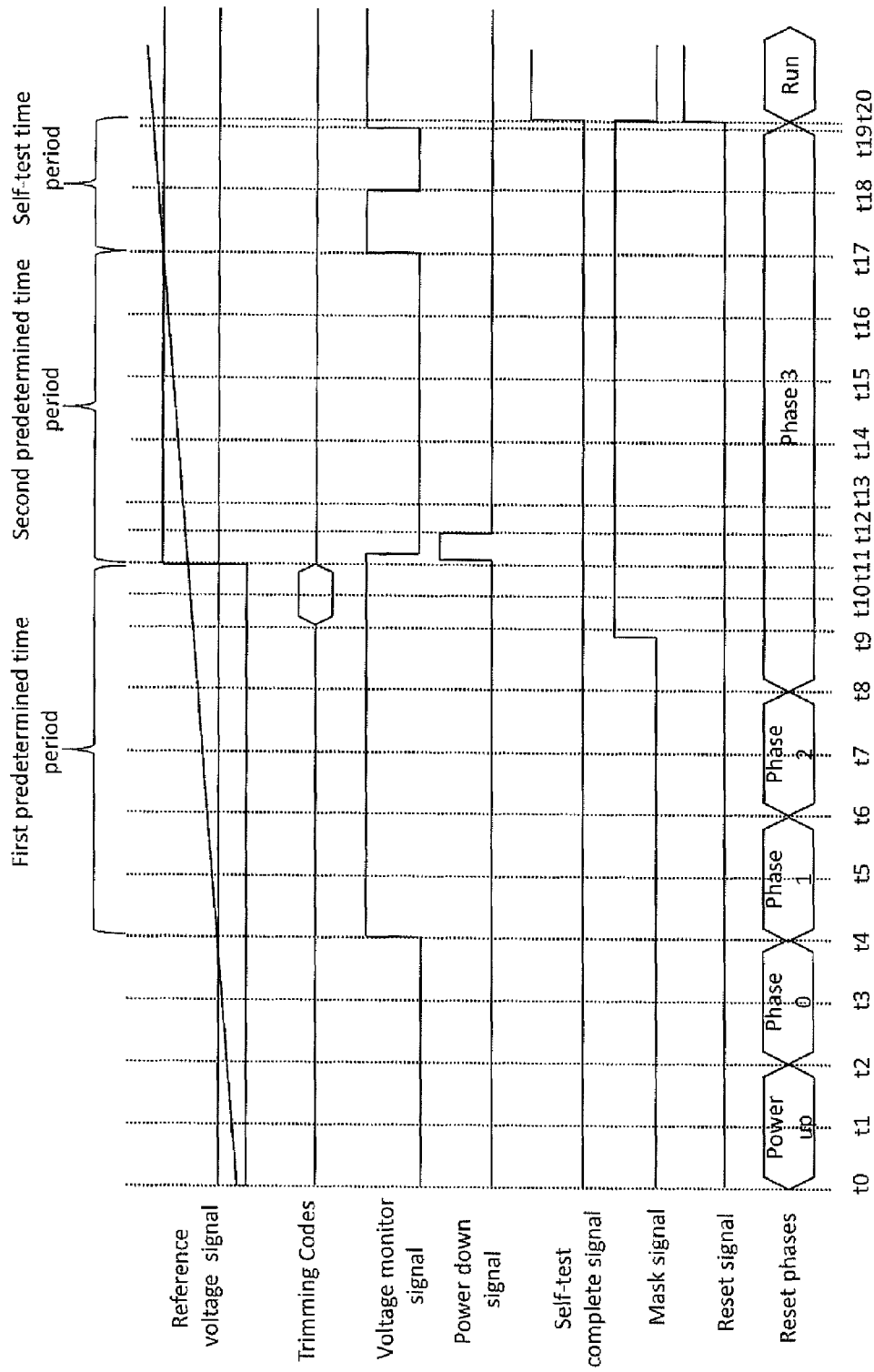
FIG. 8 is a timing diagram illustrating various signals generated by the IC of FIGS. 6 and 7 in accordance with another embodiment of the present invention.

Referring now to FIG. 8, a timing diagram that illustrates the first LVD reference voltage signal, the trimming code, the first voltage monitor signal, the power down signal, the self-test complete signal, the mask signal, the reset signal, and reset phases of the IC 600 in accordance with the embodiment of the present invention is shown.

When the IC 600 is powered up, the reset controller 608 generates a low power down signal, the self-test controller 610 generates a low select signal, the switch 712 is switched on, and the switch 714 is switched off, such that the switch 712 provides the second reference voltage signal and the mux 710 outputs the first supply voltage signal to the comparator 716. The comparator 716 compares the first supply voltage signal with the second reference voltage signal. The operation of the IC 600 during the time period t0 to t17 is explained in conjunction with FIG. 5.

At time t17, the voltage level of the first supply voltage signal exceeds the voltage level of the trimmed second reference voltage signal. The voltage comparator circuit 708 generates a high first voltage monitor signal. Similarly, at time t17, the second and third voltage monitoring circuits 602b and 602c generate the second and third voltage monitor signals at logic high state, respectively.

Thus, the second AND gate 606b generates the reset control signal at logic high state. The second AND gate 606b generates and provides the logic high reset control signal to the reset controller 608 to indicate that the first through third voltage monitor signals are at logic high state. The first LVD reference voltage signal toggles from the second reference voltage signal to the first reference voltage signal.

The self-test controller 610 generates the select signal at logic high state and the mux 710 outputs the self-test reference signal to the comparator 716. The voltage level of the self-test reference signal is less than the voltage level of the first reference voltage signal.

The comparator 716 compares the voltage levels of the self-test reference signal and the first reference voltage signal and generates the comparison signal at logic low state. Consequently, the AND gate 718 generates the first voltage monitor signal at logic low state (time period t18-t19). The first LVD reference voltage signal toggles from the first reference voltage signal to the second reference voltage signal. Further, the self-test controller 610 generates the select signal at logic low state and the mux 710 outputs the first supply voltage signal to the comparator 716. The comparator 716 compares the voltage levels of the first supply voltage signal and the second reference voltage signal. The comparator 716 generates the comparison signal at logic high state.

Consequently, the AND gate 718 generates the first voltage monitor signal at logic high state (at time t19). The self-test controller 610 receives the logic low first voltage monitor signal during the time period t18-t19 and the logic high first voltage monitor signal at time t19, and generates a self-test pass signal as the self-test status signal. However, when the AND gate 718 generates the first voltage monitor signal at logic high state during the time period t18-t19, the self-test controller 610 generates a self-test fail signal as the self-test status signal.

On generation of the self-test status signal, the self-test controller 610 generates the self-test complete signal at logic high state (time t20). Thus, the self-test controller 610 successfully performs a self-test of the first voltage monitoring circuit 602a during a self-test time period (time period t17-t20) due to the absence of the meta-stability condition of the first voltage monitoring circuit 602a.

The self-test controller 610 continues to generate the select signal at logic low state (time t20 onwards). The mux 710 outputs the first supply voltage signal to the comparator 716 that compares the first supply voltage signal with the second reference voltage signal and generates the comparison signal and consequently, the first voltage monitor signal at logic high state.

Similarly, at time t18, the second and third voltage monitoring circuits 602b and 602c generate the second and third voltage monitor signals at logic high state. Thus, the second AND gate 606b generates the reset control signal at logic high state. The reset controller 608 receives the logic high reset control signal and generates the mask signal at logic low state (time t20).

At time t20, the first through third OR gates 604a-604c continue to output the first through third control signals at logic high state. Consequently the first AND gate 606a generates the mask control signal at logic high state. The reset controller 608 generates the reset signal at logic high state based on the mask control signal and the reset control signal. Thus, the IC 600 transitions into a run mode of operation at time t20 and does not undergo a false reset after time t20.

Figure 9:
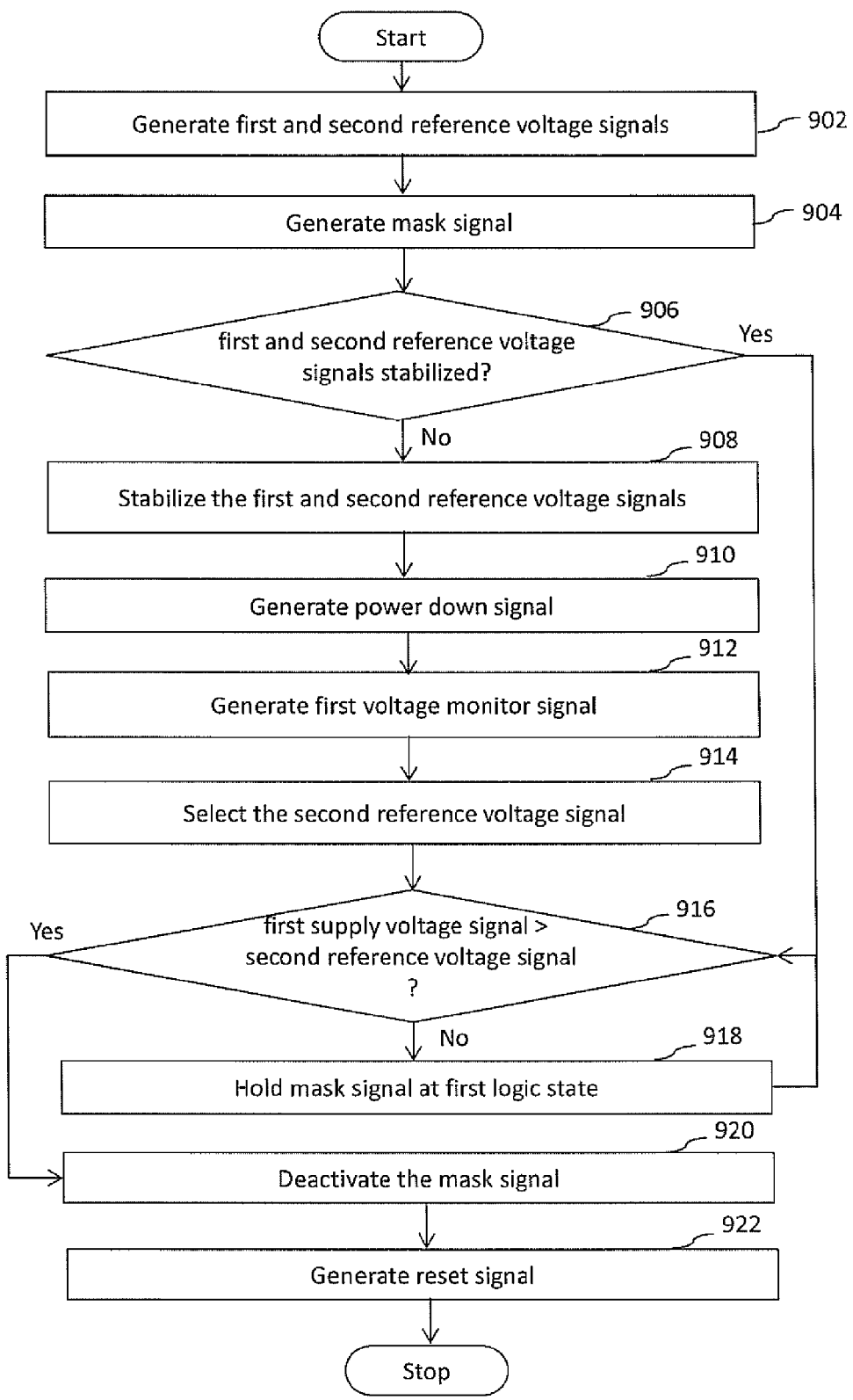
FIG. 9 is a flow chart illustrating a method of resolving meta-stability in the IC of FIGS. 3 and 4 in accordance with an embodiment of the present invention.

Referring now to FIG. 9, a flow chart that illustrates a method of resolving meta-stability in the IC 300 in accordance with an embodiment of the present invention is shown. At step 902, the first reference voltage generator 404 generates first and second reference voltage signals. At step 904, the reset controller 308 generates the mask signal at logic high state. At step 906, a check is performed to determine whether the first and second reference signals are stabilized. If at step 906 it is determined that the first and second reference voltage signals are not stabilized, step 908 is performed. If at step 906 it is determined that the first and second reference voltage signals are stabilized, step 916 is performed.

At step 908, the reset controller 308 stabilizes the first and second reference voltage signals. At step 910, the reset controller 308 generates the power down signal. At step 912, the first voltage monitoring circuit 302a generates the first voltage monitor signal at logic low state. At step 914, the switch 410 is switched on and hence, outputs the second reference voltage signal. At step 916, a check is performed to determine whether the voltage level of the first supply voltage signal exceeds the voltage level of the second reference voltage signal. If at step 916 it is determined that the voltage level of the first supply voltage signal does not exceed the voltage level of the second reference voltage signal, step 918 is performed.

At step 918, the reset controller 308 generates the mask signal at logic high state. After step 918, repeat step 916. If at step 916 it is determined that the voltage level of the first supply voltage signal exceeds the voltage level of the second reference voltage signal, step 920 is performed. At step 920, the reset controller 308 generates the mask signal at logic low state. At step 922, the reset controller 308 generates the reset signal at logic high state.

Figure 10A:
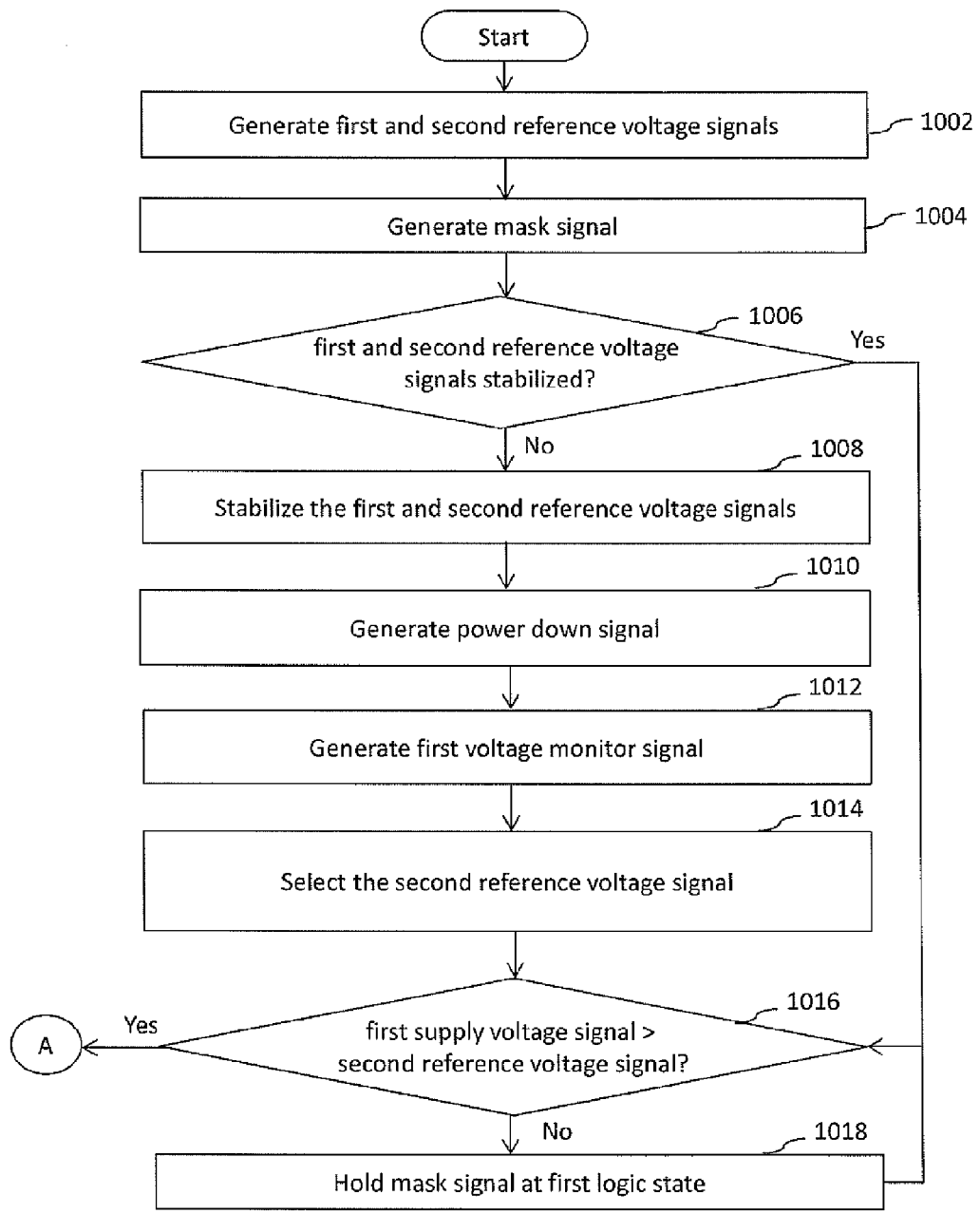
FIGS. 10A and 10B are a flow chart illustrating a method of resolving meta-stability in the IC of FIGS. 6 and 7 in accordance with another embodiment of the present invention.
Figure 10B:
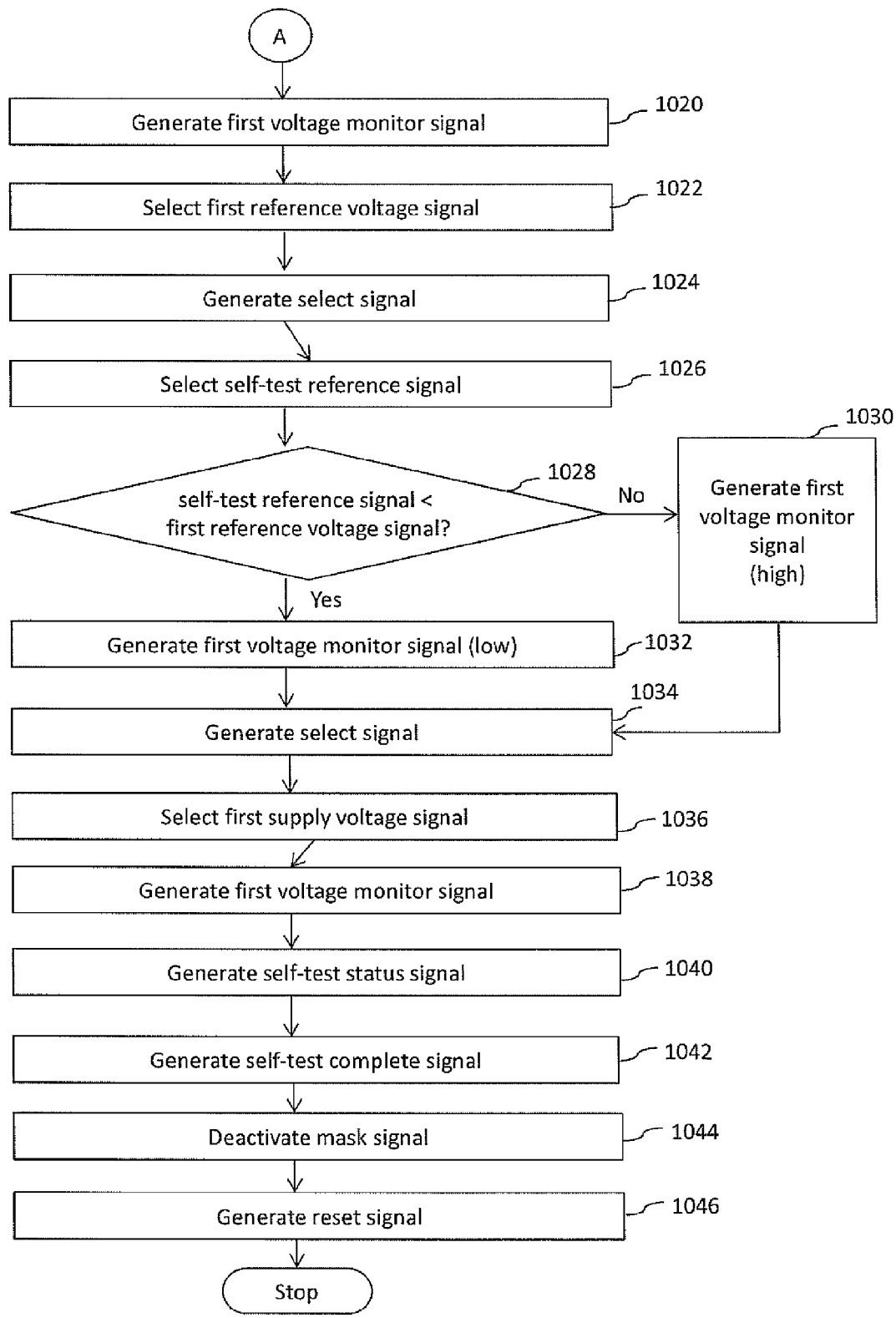

Referring now to FIG. 10, a flow chart that illustrates a method of resolving meta-stability in the IC 600 in accordance with another embodiment of the present invention is shown. At step 1002, the first reference voltage generator 704 generates first and second reference voltage signals. At step 1004, the reset controller 608 generates the mask signal at logic high state. At step 1006, a check is performed to determine whether the first and second reference signals are stabilized. If at step 1006 it is determined that the first and second reference voltage signals are not stabilized, step 1008 is performed. If at step 1006 it is determined that the first and second reference voltage signals are stabilized, step 1018 is performed.

At step 1008, the reset controller 608 stabilizes the first and second reference voltage signals. At step 1010, the reset controller 608 generates the power down signal. At step 1012, the first voltage monitoring circuit 602a generates the first voltage monitor signal at logic low state. At step 1014, the switch 712 is switched on and hence, outputs the second reference voltage signal.

At step 1016, a check is performed to determine whether the voltage level of the first supply voltage signal exceeds the voltage level of the second reference voltage signal. If at step 1016 it is determined that the voltage level of the first supply voltage signal exceeds the voltage level of the second reference voltage signal, step 1020 is performed. If at step 1016 it is determined that the voltage level of the first supply voltage signal does not exceed the voltage level of the second reference voltage signal, step 1018 is performed.

At step 1018, the reset controller 608 generates the mask signal at logic high state. At step 1020, the first voltage monitoring circuit 602a generates the first voltage monitor signal at logic high state. At step 1022, the switch 714 is switched on and outputs the first reference voltage signal. At step 1024, the self-test controller 610 generates the select signal at logic high state. At step 1026, the mux 710 selects the self-test reference signal.

At step 1028, a check is performed to determine whether the voltage level of the self-test reference signal is less than the voltage level of the first reference voltage signal. If at step 1028 it is determined that the voltage level of the self-test reference signal is not less than the voltage level of the first reference voltage signal, step 1030 is performed. If at step 1028 it is determined that the voltage level of the self-test reference signal is less than the voltage level of the first reference voltage signal, step 1032 is performed.

At step 1030, the first voltage monitoring circuit 602a generates the first voltage monitor signal at logic high state. At step 1032, the first voltage monitoring circuit 602a generates the first voltage monitor signal at logic low state. At step 1034, the self-test controller 610 generates the select signal at logic low state. At step 1036, the mux 710 selects the first supply voltage signal. At step 1038, the first voltage monitoring circuit 602a generates the first voltage monitor signal at logic high state.

At step 1040, the self-test controller 610 generates the self-test status signal. When the self-test controller 610 receives the logic low first voltage monitor signal and subsequently the logic high first voltage monitor signal, the self-test controller 610 generates the self-test pass signal as the self-status signal. When the self-test controller 610 does not receive the logic low first voltage monitor signal and subsequently the logic high first voltage monitor signal, the self-test controller 610 generates the self-test fail signal as the self-test status signal.

At step 1042, the self-test controller 610 generates the self-test complete signal. At step 1044, the reset controller 608 generates the mask signal at logic low state. At step 1046, the reset controller 608 generates the reset signal at logic high state.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit, comprising:
   a first reference voltage generator for generating a first reference voltage signal;
   a voltage regulator for generating a first supply voltage signal;
   a reset controller connected to the first reference voltage generator for stabilizing the first reference voltage signal in a first predetermined time period, and generating a power down signal after the first predetermined time period; and
   a first voltage monitoring circuit connected to the first reference voltage generator, the voltage regulator, and the reset controller, for receiving the first reference voltage signal, the first supply voltage signal, and the power down signal, respectively, and generating a first voltage monitor signal at a first logic state when a voltage level of the first supply voltage signal exceeds a voltage level of the first reference voltage signal during the first predetermined time period and at second logic state after the first predetermined time period, whereby the integrated circuit is configured in a safe state after the first predetermined time period.

2. The integrated circuit of claim 1, wherein the first reference voltage generator further generates a second reference voltage signal during the first and second predetermined time periods.

3. The integrated circuit of claim 2, wherein the voltage level of the first reference voltage signal is less than a voltage level of the second reference voltage signal, and wherein the voltage level of the first supply voltage signal exceeds the voltage level of the first reference voltage signal during the first predetermined time period, and the voltage level of the first supply voltage signal is less than the voltage level of the second reference voltage signal for a second predetermined time period after the first predetermined time period.

4. The integrated circuit of claim 3, wherein the first voltage monitoring circuit includes:
   a switching circuit for receiving the first voltage monitor signal, and connected to the first reference voltage generator for receiving the first and second reference voltage signals, and outputting the first reference voltage signal when the first voltage monitor signal is at the first logic state during the first predetermined time period, and the second reference voltage signal when the first voltage monitor signal is at the second logic state during the second predetermined time period;
   a comparator having a first input terminal connected to the switching circuit for receiving at least one of the first and second reference voltage signals, a second input terminal connected to the voltage regulator for receiving the first supply voltage signal, and an output terminal for generating a first comparison signal at the first logic state during the first predetermined time period and at the second logic state during the second predetermined time period; and
   a first logic gate having a first input terminal connected to the output terminal of the comparator for receiving the first comparison signal, a second input terminal connected to the reset controller for receiving the power down signal, and an output terminal for generating the first voltage monitor signal at the first logic state during the first predetermined time period and at the second logic state during the second predetermined time period based on the power down signal.

5. The integrated circuit of claim 4, further comprising:
a self-test controller for generating a self-test reference signal after the second predetermined time period; and
a multiplexer having a first input terminal connected to the voltage regulator for receiving the first supply voltage signal, a second input terminal connected to the self-test controller for receiving the self-test reference signal, a select terminal connected to the self-test controller for receiving a select signal, and an output terminal for outputting one of the first supply voltage and the self-test reference signals after the second predetermined time period based on the select signal, wherein the first input terminal of the comparator receives the self-test reference signal when the select signal is at a logic low level and generates the first voltage monitor signal, whereby the self-test controller detects an error in the first voltage monitoring circuit based on the logic level of the first voltage monitor signal.

6. The integrated circuit of claim 3, wherein the reset controller further generates a mask signal during the first and second predetermined time periods.

7. The integrated circuit of claim 6, further comprising a first logic gate having a first input terminal connected to the reset controller for receiving the mask signal, a second input terminal connected to the first voltage monitoring circuit for receiving the first voltage monitor signal, and an output terminal for generating a first control signal.

8. The integrated circuit of claim 7, wherein the voltage regulator further generates a second supply voltage signal.

9. The integrated circuit of claim 8, wherein the integrated circuit further includes:
a second reference voltage generator for generating third and fourth reference voltage signals;
a second voltage monitoring circuit, connected to the second reference voltage generator, the voltage regulator, and the reset controller for receiving the third and fourth reference voltage signals, the second supply voltage signal, and the power down signal, respectively, and generating a second voltage monitor signal at the first logic state when a voltage level of the second supply voltage signal exceeds the voltage level of the first reference voltage signal in the first predetermined time period and at the second logic state based on the power down signal in the second predetermined time period;
a second logic gate having a first input terminal connected to the reset controller for receiving the mask signal, a second input terminal connected to the second voltage monitoring circuit for receiving the second voltage monitor signal, and an output terminal for generating a second control signal;
a third logic gate having a first input terminal connected to the first logic gate for receiving the first control signal, a second input terminal connected to the second logic gate for receiving the second control signal, and an output terminal for generating a mask control signal; and
a fourth logic gate having first and second input terminals connected to the first and second voltage monitoring circuits for receiving the first and second voltage monitor signals, respectively, and an output terminal for generating a reset control signal.

10. The integrated circuit of claim 9, wherein the reset controller is connected to the third and fourth logic gates for receiving the mask and reset control signals, respectively, and generating a reset signal based on the mask and reset control signals after the second predetermined time period.

11. An integrated circuit, comprising:
a first reference voltage generator for generating first and second reference voltage signals;
a voltage regulator for generating a first supply voltage signal;
a reset controller connected to the first reference voltage generator for stabilizing the first reference voltage signal in a first predetermined time period and generating a power down signal after the first predetermined time period; and
a first voltage monitoring circuit for generating a first voltage monitor signal, wherein the first voltage monitoring circuit includes:
a switching circuit for receiving the first voltage monitor signal, and connected to the first reference voltage generator for receiving the first and second reference voltage signals, and outputting the first reference voltage signal when the first voltage monitor signal is at a first logic state during the first predetermined time period and the second reference voltage signal when the first voltage monitor signal is at a second logic state during the second predetermined time period;
a comparator having a first input terminal connected to the switching circuit for receiving one of the first and second reference voltage signals, a second input terminal connected to the voltage regulator for receiving the first supply voltage signal, and an output terminal for generating a first comparison signal at the first logic state when a voltage level of the first supply voltage signal exceeds a voltage level of the first reference voltage signal during the first predetermined time period and at the second logic state when a voltage level of the first supply voltage signal is less than a voltage level of the second reference voltage signal during the second predetermined time period; and
a first logic gate having a first input terminal connected to the output terminal of the comparator for receiving the first comparison signal, a second input terminal connected to the reset controller for receiving the power down signal, and an output terminal for generating the first voltage monitor signal at the first logic state during the first predetermined time period and at the second logic state during the second predetermined time period based on the power down signal, whereby the integrated circuit is placed in a safe state during the second predetermined time period.

12. The integrated circuit of claim 11, wherein the reset controller generates a mask signal during the first and second predetermined time periods.

13. The integrated circuit of claim 12, further comprising a second logic gate having a first input terminal connected to the reset controller for receiving the mask signal, a second input terminal connected to the first voltage monitoring circuit for receiving the first voltage monitor signal, and an output terminal for generating a first control signal.

14. The integrated circuit of claim 13, wherein the integrated circuit further includes:
a second reference voltage generator for generating third and fourth reference voltage signals;
a second voltage monitoring circuit, connected to the second reference voltage generator, the voltage regulator, and the reset controller, for receiving the third and fourth reference voltage signals, a second supply voltage signal, and the power down signal, respectively, and generating a second voltage monitor signal at the first logic state when a voltage level of the second supply voltage signal exceeds the voltage level of the first reference voltage signal in the first predetermined time period and at the second logic state based on the power down signal in the second predetermined time period;

a third logic gate having a first input terminal connected to the reset controller for receiving the mask signal, a second input terminal connected to the second voltage monitoring circuit for receiving the second voltage monitor signal, and an output terminal for generating a second control signal;

a fourth logic gate having a first input terminal connected to the second logic gate for receiving the first control signal, a second input terminal connected to the third logic gate for receiving the second control signal, and an output terminal for generating a mask control signal; and a fifth logic gate having first and second input terminals connected to the first and second voltage monitoring circuits for receiving the first and second voltage monitor signals, respectively, and an output terminal for generating a reset control signal, wherein the reset controller receives the mask and reset control signals and generates a reset signal based on the mask and reset control signals after the second predetermined time period.

15. A method of resolving meta-stability in an integrated circuit, the method comprising:

generating a first reference voltage signal;

generating a first supply voltage signal;

generating a first voltage monitor signal at a first logic state when a voltage level of the first supply voltage signal exceeds a voltage level of the first reference voltage signal during a first predetermined time period;

stabilizing the first reference voltage signal in the first predetermined time period;

generating a power down signal after the first predetermined time period;

generating the first voltage monitor signal at a second logic state after the first predetermined time period, whereby the integrated circuit is configured in a safe state after the first predetermined time period; and generating a second reference voltage signal during the first and second predetermined time periods, wherein the voltage level of the first reference voltage signal is less than a voltage level of the second reference voltage signal, and the voltage level of the first supply voltage signal is less than the voltage level of the second reference voltage signal for a second predetermined time period after the first predetermined time period, and wherein the step of generating the first voltage monitor signal further comprises:

receiving the first and second reference voltage signals;

receiving the first voltage monitor signal at the second logic state during the second predetermined time period;

selecting the second reference voltage signal during the second predetermined time period; and generating the first voltage monitor signal at the second logic state for the second predetermined time period.

16. The method of claim 15, further comprising:

generating a mask signal during the first and second predetermined time periods; and generating a first control signal based on the first voltage monitor signal and the mask signal during the first and second predetermined time periods.

17. The method of claim 16, further comprising:

generating a second supply voltage signal;

generating a second voltage monitor signal at the first logic state when a voltage level of the second supply voltage signal exceeds the voltage level of the first reference voltage signal in the first predetermined time period;

generating the second supply voltage monitor signal at the second logic state based on the power down signal during the second predetermined time period;

generating a second control signal based on the mask signal and the second voltage monitor signal during the first and second predetermined time periods;

generating a reset control signal based on the first and second voltage monitor signals during the first and second predetermined time periods;

generating a mask control signal based on the first and second control signals during the first and second predetermined time periods; and generating a reset signal based on the mask and reset control signals after the second predetermined time period.

* * * * *